United States Patent
Goto et al.

(10) Patent No.: US 6,235,358 B1
(45) Date of Patent: May 22, 2001

(54) PACKAGE CONTAINER AND CONTAINER CLOSURE

(75) Inventors: Hiroaki Goto; Hiroshi Sasaki, both of Tokyo (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 0 days.

(21) Appl. No.: 09/136,616

(22) Filed: Aug. 20, 1998

(51) Int. Cl.$^7$ ..................................... B32B 27/38
(52) U.S. Cl. ........................ 428/35.7; 522/25; 522/31; 428/35.8; 428/413
(58) Field of Search .............. 522/25, 31; 428/34.4, 428/34.5, 35.2, 35.3, 35.8, 36, 35.7, 66.3, 412, 413, 457

(56) References Cited

U.S. PATENT DOCUMENTS

| | | | |
|---|---|---|---|
| 3,554,770 | * 1/1971 | Lipsky et al. | 99/174 |
| 4,058,401 | * 11/1977 | Crivello | 96/115 R |
| 4,287,228 | * 9/1981 | Schlesinger | 427/54.1 |
| 4,624,912 | * 11/1986 | Zweifel et al. | 430/258 |
| 4,704,310 | * 11/1987 | Tighe et al. | 427/261 |
| 5,731,123 | * 3/1998 | Kawamura et al. | 430/176 |

FOREIGN PATENT DOCUMENTS 96-7344 6/1996 (JP) ........................ C09D/163/00

OTHER PUBLICATIONS

Aizawa et al., Derwent Abstract ZA 8207142A.*

* cited by examiner

Primary Examiner—Rena L. Dye
Assistant Examiner—Sow-Fun Hon
(74) Attorney, Agent, or Firm—Sughrue, Mion, Zinn, Macpeak & Seas, PLLC

(57) ABSTRACT

This invention related to a packaging container and a container closure having excellent curability, aesthetic beauty of an ultraviolet ray hardened coating, transferability of a container, heat-resistant treatability, retortability, and sanitary characteristics. The present invention provides to a packaging container and a container closure having, on the outer surface, a coating layer of a resin composition which comprises a cationic curable resin comprising an alicyclic epoxy resin, a photo-cationic-curing catalyst comprising a compound of the following formula (1),

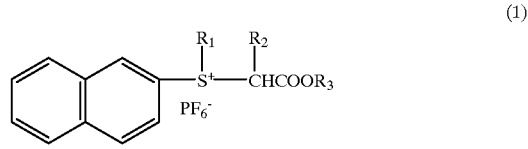

(1)

wherein each of $R_1$ and $R_2$ is an alkyl group, and they may be the same or different, and $R_3$ is an alkyl group, a sensitizer comprising a thioxanthone sensitizer, and a pigment comprising titanium dioxide, wherein the amount of said titanium dioxide is at least 0.30 mg per 1 cm$^2$ of said coating layer, the amount of said photo-cationic-curing catalyst is 1 to 20% by weight with regards to said titanium dioxide, and the amount of said sensitizer is 1.5 to 5% by weight with regards to said titanium dioxide.

9 Claims, No Drawings

PACKAGE CONTAINER AND CONTAINER CLOSURE

BACKGROUND OF THE INVENTION

1. Field of the Invention

This invention relates to a packing container and a container closure having a coating layer or a printing ink layer of an ultraviolet ray-curable resin on an outside surface, and more specifically, to a packaging container and a container closure having excellent curability, aesthetic beauty of an ultraviolet ray hardened coating, transferability of a container, heat-resistant treatability, retortability, and sanitary characteristics.

2. Prior Art

An ink or coating composition containing an ultraviolet-curable resin does not have a problem of the volatilization of a solvent in drying or baking. Furthermore, since a printed matter or a coated product does not need heating, these compositions are used in various applications or such a use have been investigated.

As examples of heretofore used ultraviolet ray-curable resin commpositions, a combination of an epoxy resin and a cationic ultraviolet ray polymerization initiator, a combination of urethane (meth)acrylate and an acrylate monomer, and an epoxy (meth)acrylate resin have been known.

Japanese technical Publication No. 7344/96 (Published on Jul. 3, 1996; Nippon Unicar Co.; developer: Eiji Ando and Kenichi Suzuki; Int.Cl. C09D163/00) describes a resin composition composed of an ultraviolet-curable resin composition comprising an aliphatic cyclic epoxy resin, a cationic polymerization initiator, and polydiorganosiloxane-polyoxyalkylene alternate block copolymer.

An ultraviolet-curable resin composition contains an photo-cationic-polymerizable epoxy-type monomer and an photo-cationic-polymerization initiator has an advantage of forming a cured coating by ultraviolet irradiation without the need of heating. However, the ultraviolet-cured coating to be formed has an insufficient degree of curing, and as a coating layer or a printing ink layer of a package container, it has an insufficient problem in transferability, heat-resistant treatability and retortability. In this packaging container, a smooth transferring operation of a container is essential in a production step and a filling step. If the degree of curing is low in the coating layer or in the printing ink layer or slidability is poor on the outer surface, the coating will be easily damaged by contact with another object or by collision with another object. Furthermore, to improve the preservability of the contents, hot filling, sterilization by pasteurizer and retort sterilization have been carried out, but known ultraviolet ray-curable resins which can withstand these heat treatments, especially retort sterilization operation, are very few.

The photo-cationic-curing catalysts are decomposed by ultraviolet rays and release Lews acid. This Lewis acid polymerizes an epoxy group, and for example, an aromatic iodonium salt, an aromatic sulfonium salt, an aromatic selenium salt and an aromatic diazonium salt are used. However, although these photo-cationic-curing catalysts have a satisfactory sensitivity to ultraviolet rays having a short wavelength of generally 280 nm or below, they do not have a sufficient sensitivity to ultraviolet rays having a long wavelength. They only can insufficiently satisfy a purpose of forming the coating layer or the printing ink layer of the containers by curing due to ultraviolet rays. The pigments contained in the coating layer or the printing ink layer absorb ultraviolet rays having a short wavelength, for example, titanium dioxide absorbs ultraviolet rays having a shorter wavelength than 380 nm.

Furthermore, the photo-cationic-curing catalysts have a problem of sanitary characteristics. Known photo-cationic-curing catalysts may have a toxicity, and an iodonium salt has a problem of irritability of a bodily part. Furthermore, antimonate has a problem because it is composed of a heavy metal salt.

Of course, these photo-cationic-curing catalysts may be used in combination with known sensitizers, but many of the sensitizers have a problem of toxicity. Such sensitizers might not show a sensitizing action on ultraviolet rays having a long wavelength. Furthermore, some sensitizer may have a strongly brown color and may color the cured coated film. Combinations of photo-cationic-curing catalysts showing satisfactory curing properties to ultraviolet rays on the long wavelength with sensitizers have not been known so much.

SUMMARY OF THE INVENTION

The present inventors have found that a combination of a photo-cationic-curing catalyst composed of a specified sulfonium salt with a thioxanthone-type sensitizer shows satisfactory curing properties to ultraviolet rays having a long wavelength without generating the above-mentioned defects even when a pigment of titanium dioxide is contained in a high optical concentration, a coating layer or a printing ink layer having excellent curability, aesthetic beauty, transferrability of a container, heat treatability, retortability, and sanitary characteristics can formed on a packaging container or a container closure.

It is an object of this invention to provide a packaging container and a container closure having an ultraviolet-curable coating layer or a printing ink layer having excellnet curability, aesthetic beauty, transferrability of a container, heat treatability. retortability, and sanitary characteristics, the above coating layer or the printing ink layer showing satisfactory curing properties on ultraviolet rays having a long wavelength.

According to this invention, there are provided a packaging container and a container closure having, on the outer surface, a coating layer of a resin composition which comprises a cationic curable resin comprising an alcyclic epoxy resin.

a photo-cationic-curing catalyst comprising a compound of the following formula (1),

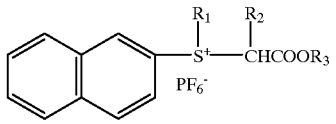

(1)

wherein each of $R_1$ and $R_2$ is an alkyl group, and they may be the same or different, and $R_3$ is a hydrogen atom or an alkyl group, a sensitizer comprising a thioxanthone sensitizer, and a pigment comprising titanium dioxide, wherein;

the amount of said titanium dioxide is at least 0.3 mg, especially 0.4 to 0.9 mg, per 1 $cm^2$ of said coating layer, the amount of said photo-cationic-curing catalyst is 1 to 20%, especially 1.5 to 10%, by weight with regard to said titanium dioxide, and the amount of said sensitizer is 1.5 to 5%. especially 1.5 to 4% by weight with regards to said titanium dioxide.

1. The photo-cationic-curing catalysts include 2-naphthyl-1-ethoxycarbonylethylmethyl sulfonium.hexafluorophosphonate (catalyst 1), 2-naphthyl-1-methoxycarbonylethylmethyl sulfonium.hexafluorophosphonate (catalyst 2) and 2-naphthyl-1-ethoxycarbonylpropylmethyl sulfonium-.hexafluorophosphonate (catalyst 3).

2. The above resin composition contains 1 to 20 parts by weight, especially 1.5 to 10 parts by weight, of the photo-cationic-curing catalyst, and 1.5 to 5 parts by weight, especially 1.5 to 4 parts by weight, of the thioxanthone-type sensitizer, per 100 parts by weight of titanium dioxide.

3. The above resin composition contains 30 to 250 parts by weight, especially 40 to 220 parts by weight, of tittanium dioxide, especially rutile-type titanium dioxide, per 100 parts by weight of the alicyclic epoxy resin.

DETAILED DESCRIPTION OF PREFERRED EMBODIMENT OF THE INVENTION

The container of this invention may be any packaging container or any container closure formed from a metal, a plastic or a laminate thereof, such as a can or a closure composed of a metal material or a coated metal material, a bottle or a closure composed of a thermoplastic resin, or a pouch or a closure composed of a thermoplastic resin laminate or a thermoplastic resin-metal foil laminate.

In this invention, a specified sulfonium salt of the above formula (1) is selected as the photo-cationic-curing catalyst, and is combined with the thioxanthone-type sensitizer, the alicyclic epoxy resin and the titanium dioxide pigment to use the combination in forming the coating layer or the printing ink layer of the package or closure.

The sulfonium salt used in this invention is structurally characterized in that the aryl group bonded to a sulfur atom is a 2-naphthyl group, a 1-alkoxycarbonylalkyl group is bonded to the sulfur atom, and moreover, the coordinated anion of the sulfonium salt is a hexafluorophosphonate anion.

This sulfonium salt shows excellent dissolvabilty and dispersibility in the alicyclic epoxy resin composition and also shows excellent curability in a combination with the below-mentioned thioxanthone-type sensitizer, especially excellent curability under conditions in which ultraviolet rays shorter than 380 nm are absorbed by the pigment, and the formed film is not injured during transferring the package container, and under retorting sterilization conditions, the formed film does not feel rough nor becomes whitened nor forms a blister, and the film has excellent heat resistance and hot water resistance.

The sulfonium salt has excellent sanitary characteristics. The results of a Ames test are negative with respect to the above-mentioned catalysts 1 to 3.

The thioxanthone-type sensitizer used in this invention has a skeleton shown in the following formula (2)

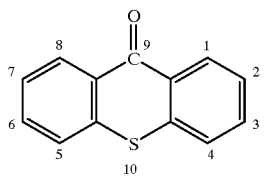

(2)

and gives an excellent sensitization effect in combination with a specified sulfonium salt, especially gives an excellent sensitization effect under conditions in which ultraviolet rays shorter than 380 nm are absorbed by the pigment. As already pointed out, many of the sensitizers have a yellow brown color, and the cured film is colored. However, this thioxanthone-type sensitizer colors a cured film comparatively seldom, and gives an excellent outer appearance of the cured film, and can increase the merchandize value of the package. Furthermore, the thioxanthone-type sensitizer has excellent sanitary characteristics among various sensitizers.

As stated above, a specified sulfonium salt-type photo-cationic-curing catalyst is combined with the thioxanthone-type sensitizer and the alicyclic epoxy resin, and by compounding the combined compounds in a coating layer or a printing ink layer of the package container, these compounds show satisfactory curing properties against ultraviolet rays having a long wavelength without showing the defects of the conventional technology. As a result, it is possible to form a coating layer or a printing ink layer having excellent curability, aesthetic beauty of a film cured by ultraviolet rays, transferrability of the container, heat treatment resistance, retortability, and sanitary characteristics on a package container.

In this invention, even when the amount of titanium dioxide is as large as at least 0.30 mg/cm$^2$ with regards to the unit area of the coating layer, a combination of the sulfonium salt-type curing catalyst and the thioxanthone-type sensitizer can give an excellent curing action by ultraviolet rays.

As described above, titanium dioxide contained in the ultraviolet-curable resin composition absorbes ultraviolet rays having a shorter wavelength than 380 nm, and retards the curing of the resin. In contrast, in spite of the fact that in the resin composition of this invention, the optical concentration of titanium dioxide is relatively high, the curing of the resin composition is carried out sufficiently by UV irradiation within a short period of time. Since the TiO$_2$ concentration is high, a satisfactory whiteness can be obtained. Furthermore, intimate adhesivenes or abrasion resistance of a coating substrate is increased, and a metallic container or closure has increased corrosion resistance. The above-mentioned advantage is obtained by compounding titanium dioxide in the resin composition. Expecially, from the standpoint of aesthetic beauty of the container, the titanium dioxide have a relatively high optical concentration of 0.30 to 1.0 mg/cm$^2$ per unit area of the coating layer. If the amount of titanium dioxide per unit area of the coating layer is lower than the above range, an excellent outer appearance cannot be obtained, and on the other hand, if the amount of titanium dioxide exceeds the above range, there is no extreme change in hiding power nor a particular advantage.

To obtain UV curability within a short period of time, the photo-cationic-curing catalyst should be used in an amount of 1 to 20% by weight, especially in an amount of 1.5 to 10% by weight with regards to the titanium dioxide. On the other hand, the amount of the sensitizer per titanium dioxide should be 1.5 to 5% by weight, especially 1.5 to 4% by weight. When the amount of the sensitizer is lower than the above range, UV curability tends to be decreased. On the other hand, if the amount of the sensitizer is larger than the above range, the hardened resin layer tends to be colored in a color phase inherent to the sensitizer, namely a yellow color.

[Photo-cationic-polymerizable Epoxy Resin]

The photo-cationic-polymerizable epoxy resin includes an epoxy resin component having an alicyclic group in the molecule in which a carbon atom ajacent to the alicyclic group forms an oxirane ring. For example, epoxy compounds having at least one epoxycycloalkane group within the molecule such as an epoxycyclohexane ring or an epoxycyclopentane ring are used singly or as mixtures.

Suitable examples include vinylcyclohexene diepoxide; vinylcyclohexene monoepoxide; 3,4-epoxycyclohexylmethyl-3,4-epoxycyclohexane carboxylate; 2-(3,4-epoxycyclohexyl-5,5-spiro-3,4-epoxy) cyclohexane-m-dioxane; bis(3,4-epoxycyclohexyl)adipate; and limonen dioxide.

In the present invention, the above alicyclic epoxy resins may be used singly or as mixtures of at least two resins, or with another epoxy resin. Other epoxy resins are general-purpose resins derived from polyvalent phenols such as bisphenols and epihalohydrins. A epoxy resin composed of repeating units expressed by the formula (3)

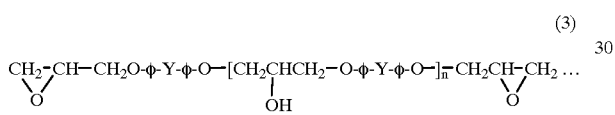

(3)

wherein φ is a phenylene group, and y is a bridging group such as a methylene group, an ethylidene group or a 2,2-propylidene group is suitable. This epoxybisphenol-type resin preferably has an epoxy equivalent of 3000 to 5500, and a number average molecular weight of 3500 to 5000.

In the epoxy resin used in this invention, the alicyclic epoxy resin component accounts for at least 70% by weight, especially at least 80% by weight, of the total epoxy resin preferably in respect of the curability of ultraviolet rays.

[Photo-cationic-curing Catalyst]

In this invention, as the photo-cationic-curing catalyst, the sulfonium salt expressed by general formula (1) is used. In general formula (1), examples of the alkyl groups $R_1$, $R_2$ and $R_3$ are alkyl groups having not larger than 4 carbon atoms, such as a methyl group, an ethyl group, a propyl group and a butyl group. $R_1$ is preferably a methyl group; $R_2$ is preferably a methyl group or an ethyl group; and $R_3$ is preferably a methyl group or an ethyl group.

Especially preferred sulfonium salts include a 2-naphthyl-1-ethoxycarbonyl ethylmethylsulfonium hexafluorophosphonate (catalyst 1), namely the following formula (4), namely a sulfonium salt expressed by the following formula (4)

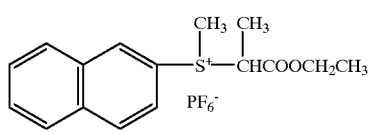

(4)

a 2-naphthyl-1-methoxycarbonylethylmethylsulfonium hexafluorophosphonate (catalyst 2), namely a sulfonium salt expressed by the following formula (5)

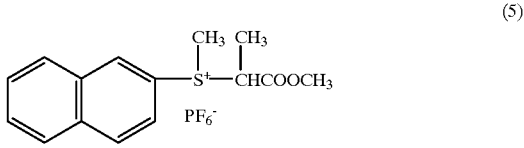

(5)

2-naphthyl-1-ethoxycarbonylpropylmethylsulfonium hexafluorophosphonate (catalyst 3), namely a sulfonium salt expressed by the following formula (6).

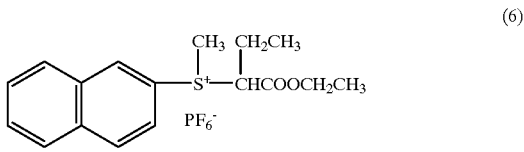

(6)

The above sulonium salts used in this invention can be obtained by reacting 2-naphthyl-1-alkoxycarbonylalkyl sulfide expressed by the following formula (7)

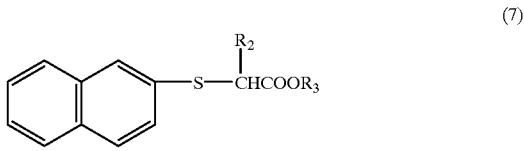

(7)

wherein $R_2$ and $R_3$ are as defined above,
with a dialkylsulfuric acid expressed by the following formula (8)

$(R_1O)_2SO_2$ (8)

wherein $R_1$ is as defined above,
and reacting the reaction product with potassium phosphate 6-fluoride.

[Thioxanthone-type Sensitizers]

Sensitizers used in this invention are known compounds having a thioxanthone skeleton, and any thioxanthone-type compounds may be used.
Preferred thioxanthone-type sensitizers are compounds of the following formula (9)

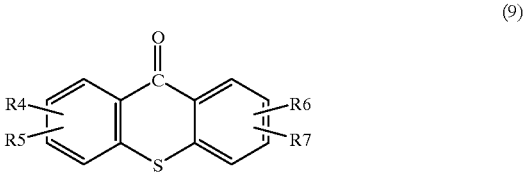

(9)

wherein $R_4$, $R_5$, $R_6$ and $R_7$ may be the same or different and represent a hydrogen atom, an alkyl group or a chlorine atom.

Specific compounds include 2,4-diethylthioxanthone, 2-isopropylthioxanthone, 4-isopropylthioxanthone, 1-chloro-4-propoxythioxanthone, and mixturess thereof. The resent invention is of course not limited to these examples.

[Ultraviolet-curable Resin Compositions]

The ultraviolet-curable resin composition used in this invention may include the alicyclic epoxy resin, the specified sulfonium salt-type photo-cationic-curing catalyst, the thioxanthone-type sensitizer and titanium dioxide as essential components.

It is preferred that the specified sulfonium salt-type photo-cationic-curing catalyst is used in an amount of 1 to 20 parts by weight, especially in an amount of 1.5 to 10 parts by weight, per 100 parts by weight of titanium dioxide. If the amouunt of the sulfonium salt-type photo-cationic-curing catalyst is below the above range, sufficient ultraviolet curability cannot be obtained. On the other hand, when the amount of the sulfonium salt-type photo-cationic-curing catalyst exceeds the above range, no particular advantage is obtained. Economically, it is disadvantageous, and the catalyst residue will cause adverse effects.

On the other hand, the thioxanthone-type sensitizer may be used in an amount of 1.5 to 5 parts by weight, especially in an amount of 1.5 to 4 parts by weight, per 100 parts by weight of titanium dioxide. If the amount of the thioxanthone-type sensitizer is below the above-mentioned range, sufficient ultraviolet curability cannot be obtained. On the other hand, if the amount of the thioxanthone-type sensitizer exceeds the above range, no particular advantage can be obtained. Economically, it becomes disadvantageous, and excessive sensitizer tends to cause coloration of the film.

The ultraviolet ray-curable resin composition used in this invention may contain a cross-linking agent, a crosslinking promotor, a reactive diluent, a plasticizer, a lubricant, a levelling agent and a pigment such as titanium dioxide according to known recipes.

In the ultraviolet ray-curable resin composition used in this invention, especially in a composition used as a coating layer, a hydroxyl-containing ethylenically unsaturated monomer, especially a monomer expressed by the formula (10)

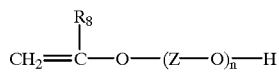

$$CH_2=\overset{R_8}{\underset{|}{C}}-O-(Z-O)_n-H \qquad (10)$$

wherein $R_8$ is a hydrogen atom or a lower alkyl group, Z is an alkylene group having 2 to 6 carbon atoms, and n is a number of at least 1, may be added as a cross-linking agent also serving as a diluent.

With respect to cationic polymerizability, the hydroxyl-containing ethylenically unsaturated monomer is preferably a monomer having an ether group bonded to the ethylenically unsaturated carbon atom, more specifically, a monomer expressed by the general formula (10). This chemical structure imparts high cationic polymerization activity, and give a pliable structure composed of an aliphatic ether linkage.

In the general formula (10), the alkylene group may be a straight chaian alkylene group or a branched chain alkylene group. The number of n is not particularly limited, but preferably may be a number of 4 or below. Examples of this monomer may include 4-hydroxybutyl ether, 1,6-hexanediol monovinyl ether, neopentyl glycol monovinyl ether, ethylene glycol monovinyl ether, diethyleneglycol monovinyl ether, triethylene glycol monovinyl ether, dipropylene glycol monovinyl ether, tripropylene glycol monovinyl ether, dibutylene glycol monovinyl ether, tributylene glycol monovinyl ether, pentaerythritol divinyl ether, trimethylol propane monovinyl ether, trimethylol propane divinyl ether, pentaerythritol monovinyl ether and dipentaerythritol divinyl ether.

The hydroxyl-containing ethylenically unsaturated monomer may be used in an amount of 2 to 30 parts by weight, especially in an amount of 5 to 20 parts by weight, per 100 parts by weight of the alicyclic epoxy resin.

Examples of other reactive diluents include polyvalent alcohol derivatives and oxetane compounds. The polyvalent alcohol derivatives may contain at least one known hydroxyl group. Examples of the oxetane compounds are 3-ethyl-3-phenoxymethyloxetane, 3-methyl-3-hydroxymethyloxetane, and 3-ethyl-hydroxymethyloxetane. These polyvalent alcohol derivative or the oxetane compounds are used preferably in an amount of 1 to 15 parts by weight, especially in an amount of 2 to 10 parts by weight, per 100 parts by weight of the alicyclic epoxy resin.

Other examples of the cross-linking agent include resins containing an epoxy group within the molecule such as epoxidized polybutadiene and resins containing a hydroxyl group in the molecule. These resin-type cross-linking agents can be used in an amount of 2 to 30 parts by weight, especially 5 to 20 parts by weight, per 100 parts by weight of alicyclic epoxy resin.

The organic silicone-type resin used as an arbitrary component in this invention may be any desired organic silicone-type resins if they impart levelling property to the formed ultraviolet ray-cured resin layer and slidability to ultraviolet ray cured resin film. Preferred examples of the organic silicone-type resins include polyalkylhydrogen siloxanes containing alkyl groups containing 1 to 18 carbon atoms, especially alkyl (7 to 8 carbon atoms) modified products of polymethylhydrogen siloxanes.

As organic silicone-type resins, polyorganosiloxane-polyoxyalkylene block copolymers described in the above-mentioned Japanese technical Publication described above may be used.

The organic silicone resins may be used in an amount of 0.05 to 2 parts by weight, especially 0.1 to 1 part by weight, per 100 parts by weight of the alicyclic epoxy resin.

Pigments used in inks and paints may be those comprising of titanium dioxide as a main component but not limited to these materials.

Even pigments which cause curing obstruction may be used sufficiently if these pigments are coated.

Black Pigments

Carbon black, acetylene black, lamp black and aniline black.

Yellow Pigments

Chrome yellow, zinc yellow, cadmium yellow, yellow iron oxide, mineral fast yellow, nickel titanium yellow, naples yellow, naphthol yellow S, Hansa Yellow G, Hansa Yellow 10G, Benzidine Yellow G, Benzidine Yellow GR, quinoline yellow lake, Permanent Yellow NCG, and Tartrazine Lake.

Orange Pigments

Chrome orange, molybdenum orange, Permanent Orange GTR, pyrazolone orange, Vulcan Orange, Indanthrene Brilliant Orange RK, Benzidine Orange G, and Indanthrene Brilliant Orange GK.

Red Pigments

Red iron oxide, cadmium red, red lead, cadmium mercury sulfide, Permanent Red 4R, Lithol Red, pyrazolone red, Watchung Red Calcium Salt, Lake Red D, Brilliant Carmine 6B, eosine lake, Rhodamine Lake B, Alizarine Lake and Brilliant Carmine 3B.

Violet Pigments

Manganese violet, Fast Violet B, and methyl violet lake.

Blue Pigments

Prussian Blue, cobalt blue, alkali blue lake, Victoria blue lake, phthalocyanine blue, non-metallic phthalocyanine blue, partially chlorinated phthalocyanine blue, Fast Sky Blue and Indanthrene Blue BC.

Green Pigments

Chrome green, chromium oxide, Pigment Green B, malachite green lake and Final Yellow Green G.

White Pigments

Zinc white, antimony white and zinc sulfide.

Extender Pigments

Baryta powder, barium carbonate, clay, silica, white carbon, talc and alumina white.

The above pigments may be used in an amount of 200 parts by weight or below, especially 180 parts by weight or below per 100 parts by weight of the resin composition.

A lubricant may be compounded in the ultraviolet ray-curable resin composition to impart slidability to an outside surface.

Examples of the lubricant include (a) hydrocarbon-type compounds such as flowing, natural or synthetic paraffins, microwaxes, polyethylene waxes, and chlorinated polyethylene waxes; (b) aliphatic acid compounds such as stearic acid and lauric acid; (c) aliphatic acid monoamide-type compounds or bisamide-type compounds such as stearamide, palmitamide, oleamide, esilic acid amide, methylenebisstearamide, and ethylenebisstearamide; (d) ester-type compounds such as butyl stearate, hardened castor oil and ethylene glycol monostearate; (e) alcohol-type compounds such as cetyl alcohol and stearyl alcohol; (f) metal soaps such as zinc stearate, magnesium stearate and calcium stearate; and (g) mixtures of the above compounds.

These lubricants may be used in an amount of 10 parts by weight or below, especially 2 to 8 parts by weight, per 100 parts by weight of the resin composition.

A plasticizer may be contained in the ultraviolet ray-curable resin composition to impart flexibility or pliability to the coated film. Examples of the plasticizer include ester-type plasticizers such as phthalic acid ester-type plasticizers, adipic acid ester-type plasticizers and succinic acid ester-type plasticizers; polyester-type plasticizers, phosphoric ester-type plasticizers and chlorine-type plasticizers.

These plasticizers may be used in an amount of 15 parts by weight or below, especially 1 to 10 parts by weight, per 100 parts by weight of the resin composition.

Since the ultraviolet ray-curable resin composition used in this invention shows a marked non-Newtonian behavior, it is difficult to define its viscosity. But a shearing speed at an apparent viscosity at 1 $sec^{-1}$ may desirably be in a range of 1 to 5000 poises (p, 20° C.).

The ultraviolet ray-curable resin composition of this invention may include an acrylate-type radical curable monomer, an oligomer and a radiical curable initiator for the purpose of increasing curability in an early period. The amount of the acrylate-type radical curable monomer and the oligomer to be compounded may desirably be not larger than 20 parts by weight. especially not larger than 15 parts by weight per 100 parts by weight of the resin composition of this invention. The acrylate-type monomer and the oligomer may be known monomers and oligomers, but acryloyl morpholine and urethane acrylate are not preferred because they cause curing obstruction of the resin composition of this invention. The radical curable initiator may be a known one, but alpha-aminoalkylphenone-type photo-polymerization initiators are not preferred because these compounds cause curing obstruction of the resin composition of this invention.

Known resins not having a crosslinkable functional group (such as an epoxy group, a hydroxyl group, an oxetanyl group and an unsaturated vinyl group) may be compounded in the ultraviolet ray-curable resin composition of this invention to alleviate curing shrinkage due to the crosslinkage of the resin or to adjust the hardness of a coated film. Examples of the resins may include acrylic resins and petroleum resins, not limited these resins.

It is possible to mix other known photo-cationic-curing catalysts with the resin composition of this invention. Examples of the other photo-cationic-curing catalysts are preferably triaryl sulfonium salts containing phosphorus as a counter ion from a sanitary characteristic. Preferably specific examples are diphenyl-4-phenylthiophenylsulfonium hexafluorophosphate and bis-[4-(diphenylsulfonio)phenyl] sulfidebishexafluorophosphate.

[Packaging Container and Container Closure]

A container provided with a coating layer or a printing ink layer may be any packaging container or container closure formed from a metal, a plastic or a laminated body thereof, such as a can or a closure composed of a metal material or a coated metal material, a bottle composed of a thermoplastic resin, and a cup, pouch or tube composed of a laminated body of a thermoplastic resin or a thermoplastic resin metal foil laminated body. In particular, the present invention is useful as an undercoat for a canning can or a cup for heat sterilization such as retort sterilization or for a bottle, a pouch or a tube. The present invention is also useful as a printing ink or a top coating layer. These examples will be described below.

(1) Canning Can and a Container Closure

As the canning can, examples are seamless or press-formed cans formed by draw formation and deep draw formation or draw formation and ironing of a metal material or a resin coated metal material. A thermoplastic resin film such as a polyester is laminated on the surface of a metal substrate, and the laminated body is subjected to a deep draw formation or draw formation and ironing to form a product having excellent corrosion resistance and processability. This polyester coated layer has excellent barrier resistance against mechanical properties and a corrosive component, but has is poor intimate adhesiveness to a white coat, a printing ink, or a finishing varnish. When the resulting can body after providing a coat, an ink or a varnish is subjected to a neck-in processing or a bead processing, there is a problem that the ink or varnish easily peels off.

When the resin composition of this invention is placed on the polyester-coated layer of the can in the form of a white coat or ink, and is subjected to an ultraviolet ray curing, the resin composition did not receive an injury such as peeling even after the resin composition was subjected to a severe neck-in processing or a bead processing. When the contents were filled and after sealing, were subjected to a sterilization by retorting, excellent intimate adhesiveness was maintained and a merchandize value could be increased.

Various surface-treated steel sheets or light metal sheets such as aluminium may be used as a metal sheet constituting the can. As the surface-treated steel sheets, a cold rolled steel sheet is annealed, is secondarily cold rolled, is subjected to at least one surface treatment such as zinc plating, tin plating, nickel plating, and is treated with an electrolytic chromic acid, or with chromic acid. One example of a preferred surface-treatetd steel sheet is an electrolytically chromic acid-treated steel sheet, especially having 10 to 200 $mg/m^2$ of a metal chromium layer and 1 to 50 $mg/m^2$ (calculated as metal chromium) of a chromium oxide layer. This treated steel sheet has an excellent combination of film intimate adhesiveness and corrosion resistance. Another example of the surface-treated steel sheet is a hard tin plate having 0.5 to 11.2 g/m² of the tin plated amount. This tin plate is desirably subjected to a chromic acid treatment or a chromic acid/phosphoric acid treatment so that the amount of chromium may be 1 to 30 mg/m² calculated as metal chromium. Yet another example is an aluminum-coated steel sheet plated with aluminum, or press-contacted with aluminum. Among these examples, when the above-mentioned technology is applied to the electrolytic chrome treated steel sheet, the effect is especially great.

As the light metal sheet, a pure aluminum sheet and another aluminum alloy sheet may be used. An aluminum alloy sheet having excellent corrosion resitance and processability has a composition comprising 0.2 to 1.5% by weight of Mn, 0.8 to 5% by weight of Mg, 0.25 to 0.3% by weight of Zn, 0.15 to 0.25% by weight of Cu and the remainder containing Al. It is desirable that these light metal sheets are subjected to a chromic acid treatment or a chromic acid/phosphoric acid treatment so that the amount of chromium, calculated as metallic chromium, may become 20 to 300 mg/m².

The thickness of the blank of the metal sheet, namely the thickness (tB) of a can bottom portion, differs depending upon the type of the metal, the use of the container, or the size of the container. Generally, it has a thickness of 0.10 to 0.50 mm. Among the metal sheets, the surface-treated steel sheet preferably has a thickness of 0.10 to 0.30 mm. Furthermore, the light metal sheet preferably has a thickness of 0.15 to 0.40 mm.

A crystalline thermoplastic resin is preferred as a thermoplastic resin to be coated on the metal sheet. Examples of the above resin include an olefin resin film such as polyethylene, polypropylene, ethylene-propylene copolymer, ethylene-vinyl acetate copolymer, ethylene-acrylic acid ester copolymer and an ionomer; polyesters such as polyethylene terephthalate, polybutylene terephthalate, and ethylene terephthalate/isophthalate copolymer; polyamides such as nylon 6, nylon 6,6, nylon 11 and nylon 12; polyvinyl chloride; and polyvinylidene chloride.

Coating of the thermoplastic resin on the metal sheet can be carried out by a heat-melting method, dry lamination and an extrusion coating method. When adhesiveness (heat-melting property) between the coated resin and the metal sheet is poor, it is possible to interpose a urethane-type adhesive, an epoxy-type adhesive, an acid-modified olefin resin-type adhesive, a copolyamide-type adhesive, and a copolyester-type adhesive.

The thickness of the thermoplastic resin is generally 3 to 50 micron ($\mu$m), especially 5 to 40 micron. In the case of heat-melting using a film, the film may be unstretched or stretched.

An especially preferred film may be produced by molding a polyester composed of an ethylene terephthalate as a main unit into a film by a film-forming method such as a T-die method or an inflation film-forming method, biaxially stretching the film successively or simultaneously at a stretching temperature of the film, and heat-setting the streched film.

As a starting polyester, polyethylene terephthalate can be used under markedly restricted stretching, heat-setting and laminating conditions. It is desirable that the maximum degree of crystallization to which the film can reach is decreased in view of impact resistance or processability. To achieve this end, it is desirable to introduce a copolymer ester unit other than ethylene terephthalate into the polyester. It is especially preferred to use a biaxially stretched film of a copolymerized polyester containing an ethylene terephthalate unit as a main component and containing a small amount of another ester unit and having a melting point of 210 to 252° C. The melting point of homopolyethylene terephthalate is generally 255 to 265° C.

The used copolyester should have a molecular weight sufficient for forming a film. For this purpose, the copolyester desirably have an intrinsic viscosity (I. V.) of 0.55 to 1.9 dl/g, especially 0.65 to 1.4 dl/g.

An adhesive primer provided as desired between the polyester film and the metal blank shows an excellent adhesiveness to both of the film and the metal blank. Typical examples of the primer paint having excellent intimate adhesiveness and corrosion resistance include phenol epoxy type paints composed of resol-type phenol aldehyde resins derived from various phenols and formaldehyde, and bisphenol-type epoxy resin, especially paints composed of phenol resins and epoxy resins in a weight ratio of 50:50 to 5:95, especially in a weight ratio of 40:60 to 10:90.

The adhesive primer layer may be provided in a thickness of 0.3 to 5 micron. The adhesive primer layer may be provided on a metal blank or on a polyester film in advance.

Molding into a metal cup container may be carried out by any known means so that the side wall portion may be reduced in thickness. For example, it is carried out by a draw-redraw-ironing processing, a draw-bending-redraw forming and a draw-bending-ironing processing.

For example, according to a deep draw-bending molding (draw-bending-redraw molding), a pre-drawn cup molded from the coated metal sheet is held by an annular holding member inserted in the cup and a redraw die positioned below the above holding member. Coaxially with the holding member and the redraw die, the redraw is arranged so that it can go into and out of the holding member. The redraw punch and the redraw die are relatively moved so that they bite with each other.

The side wall portion of the pre-drawn cup starts from the outer peripheral surface of the annular holding member, passes through a portion defined by the annular bottom surface of the annular holding member bent diametrically and perpendicularly and the upper surface of the redraw die via a curvature corner portion, is bent perpendicularly in an axial direction by the acting corner portion of the redraw die, and can be molded into a deep drawn cup having a smaller diameter than the pre-drawn cup.

The radius of curvature (Rd) of the acting corner portion of the redraw die is adjusted to 1 to 2.9 times, especially 1.5 to 2.9 times, the thickness of a metal sheet blank (tB), whereby thickness reduction can be effectively carried out by the bending and pulling of the side wall portion. In addition, variations in thickness between a lower portion and an upper portion of the side wall portion are dissolved, and uniform thickness reduction becomes possible on the whole. Generally, the side wall portion can be thickness-reduced so that a thickness-reduction rate (R) defined by the following formula is adjusted to 5 to 45%, especially 5 to 40%.

$$R = \frac{tB - tW}{tB} \times 100$$

wherein tB is the thickness of the blank, and tw is the thickness of of the side wall portion.

In the case of a deep drawn can, the draw ratio (RD) defined by the following formula is 1.1 to 3.0 in a first step, and 1.5 to 5.0 as a total.

$$RD = \frac{D}{d}$$

wherein D is the diameter of a laminate material, and d is the diameter of a punch.

An ironing die is provided rearwardly of redraw processing or bending-redraw processing, and the side wall portion can be thickness-reduced so that the thickness-reduction rate including ironing processing becomes 5 to 70%, especially 10 to 60%.

(2) Plastic Packaging Containers

Examples of the plastic packaging containers include a bottle, a cup, a tube, a plastic can, a pouch and a cap.

Molding into plastic containers may be carried out by using an extruder and an injection molding machine. As the extruder, extruders equipped with any screws may be preferably used. As the dies, a flat die and a ring die may be used. In the molding of films, a T-die method and an inflation film-forming method may be used. By hollow molding of an extruded parison, hollow-molded containers such as bottles, tubes and tanks may be produced.

As the injection molding machines, known molding machines provided with an injection plunger or a screw may be used. The above-mentioned plastics are injected into an injection mold through a nozzle, a sprue and a gate whereby the resin flows into an injection cavity and is cooled and solidified to become a preform for a molding container or a stretch blowing molding.

As the plastics constituting the containers, an olefin resin, a polyester resin, a polyamide resin and a polycarbonate are preferably used.

Examples of the olefin resin include low-, medium- or high-density polyethylene (LDPE, MDPE, HDPE), isotactic polypropylene (PP), linear low-density polyethylene (LLDPE), ethylene-propylene copolymer, polybutene-1, ethylene-butene-1 copolymer, propylene-butene-1 copolymer, ethylene-propylene-butene-1 copolymer, ethylene-vinyl acetate copolymer, ionically crosslinked olefin copolymers (ionomers), ethylene-acrylic acid ester copolymer, and blends of these polymers. It is the advantage of this invention that coatings or printing can be applied to resins having a low melting point such as linear low-density polyethylene.

Examples of the polyester include polyesters such as polyethylene terephthalate (PET), polybutylene terephthalate, polyethylene naphthalate and ethylene terephthalate/isophthalate copolymer and blends of such resins.

On the other hand, examples of the polyamide include nylon 6 (N6), nylon 6,6 (N6,6), nylon 11 and nylon 12; copolyamides such as nylon 6/6,6; and blends of at least two of the above polyamides.

As polycarbonate (PC), polycarbonates from bis phenols such as bisphenol A or F, and polycarbonate Z may be used.

Plastic containers or webs for forming pouches may be a single layer plastic container or web, or a multilayer plastic container or web. For example, they may be a laminate composed of the same resins composed of a linear low-density polyethylene as an outside surface layer and a high-density polyethylene or isotactic polypropylene as an inner layer, or a laminate composed of different types of resins such as an olefin resin and a polyester or a polyamide. Of course, the above molded article or web is not limited to a two layer combination, and it may be composed of multilayers or three or four layers or more.

These plastic containers or webs may include other plastics or metal foils. For example, to impart gas impermeability to oxygen to containers formed, a gas barrier resin or an aluminum foil or a steel foil may be assembled in a multilayer structure.

A gas barrier resin may generally have an oxygen permeability coefficient ($PO_2$) of $5.5 \times 10^{-12}$ cc.cm/cm$^2$.sec.cm Hg or below, especially $4.5 \times 10^{-12}$ cc.cm/cm$^2$.sec.cm Hg or below. The barrier resin may be an ethylene-vinyl alcohol copolymer having an ethylene content of 20 to 50 mole % and an unsaponified vinyl ester residue content of not larger than 5 mole %, and a homopolyamide, a copolyamide or a blend thereof containing 3 to 30, especially 4 to 25, of amide groups per 100 of carbon atoms. Of course, the above-mentioned ethylene-vinyl alcohol copolymer and the polyamide may be used in the form of a blend. Within the range which does not impede the essence of the resin, for example in a range of not larger than 20% by weight of another thermoplastic resin such as a resin for imparting adhesiveness between polyolefins may be used as a blend. These gas barrier resins can be provided as a very thin layer compared with the entire thickness. Even if these resins have absorptions in the near infrared region, their effects are small.

To substitute for the intermediate layer, or together with the above intermediate layer, a resin layer containing an oxygen absorbing agent or a resin layer containing a dryer may be provided as an intermediate layer. Furthermore, to re-use a regrind (scrap resin), it may be used as an intermediate layer.

The coating layer or the printing ink layer may be directly provided on the plastic molding containers. The application of the coating layer or the printing ink layer on the pouch can be carried out on the web before bag making, and thereafter bag making is carried out by heat sealing.

[Application and curing]

Coating of ultraviolet ray-curable paint, such as an undercoat of white coat, est., may be performed by using a gravure roll, or an ordinary coating roll. The coating thickness of white coat is generally in a range of 3 to 20 micron.

On the other hand, the ultraviolet ray-curable ink may be printed by a known can-making printing method such as offset printing, lithography, gravure printing and screen printing.

When two layers of a printing ink layer and a finishing varnish layer are provided, the two layers are formed in a wet-on-wet relation and these are subjected to ultraviolet curing to cure them at a stroke.

When three layers of a white coat layer a printing ink layer and a finishing varnish layer are provided, at first, the white coat layer is formed and cured, and then the printing ink layer and the finishing varnish layer are formed in a wet-on-wet relation and both layers are subjected to ultraviolet curing to cure them at a stroke.

Ultraviolet rays used to cure the ink layer are rays which include a near ultraviolet region and generally have a wavelength of 200 to 440 mm, especially 240 to 420 nm. A halide lamp, a high-pressure mercury lamp, and a low-pressure mercury lamp are used as an ultraviolet light source. Since the thickness of the ink layer or the finishing varnish layer is extremely small, it is an advantage that the energy required for curing may be small. An energy of 500 to 5000 joule/m$^2$ is generally sufficient.

The coating layer and the printing ink layer after irradiation of ultraviolet rays, as desired, are heated at a temperature of 30 to 80° C. whereby distortions are removed and post-curing is carried out. Of course, this operation is arbitrary.

EXAMPLES

The present invention will be described in detail by the following Examples.

[Production of initiators]

(1) 2-Naphthyl-1-ethoxycarbonylethylmethylsulfonium hexafluorophosphonate (catalyst 1)

2-Naphthyl-1-ethoxycarbonylethylsulfide (27.64 g) was mixed with 13.24 g of dimethylsulfuric acid and the mixture was reacted at 80° C. for 10 hours. The reaction product was dissolved in 300 ml of distilled water and 100 ml of ethyl acetate. The solution was stirred, and the aqueous solution layer was taken out, and 18.41 g of potassium hexafluorophosphate and 300 ml of ethyl acetate were added to the aqueous solution layer. The solution was stirred vigorously. The ethyl acetate layer was washed with 100 ml of distilled water two times. The water of the ethyl acetate layer was removed with anhydrous magnesium sulfate. Then, ethyl acetate was evaporated, followed by drying at 40° C. under reduced pressure to give the desired product.

(2) 2-Naphthyl-1-methoxycarbonylethylmethylsufonium hexafluorophosphonate (catalyst 2)

2-Naphthyl-1-methoxycarbonylethylsulfide (24.63 g) was mixed with 13.24 g of dimethylsulfuric acid, and the mixture was reacted at 80° C. for 10 hours. The reaction product was dissolved in 300 ml of distilled water and 100 ml of ethyl acetate. The mixture was stirred, and the aqueous solution layer was taken out. Potassium hexafluorophosphate (18.41 g) and 300 ml of ethyl acetate were added to the aqueous solution layer, and the mixture was vigorously stirred. The ethyl acetate layer was washed twice with 100 ml of distilled water. The water of the ethyl acetate layer was removed with anhydrous magnesium sulfate, and then ethyl acetate was evaporated, followed by drying at 40° C. under reduced pressure to give the desired product.

(3) 2-Naphthy-1-ethoxycarbonylpropylmethylsulfonium hexafluorophosphonate (catalyst 3)

2-Naphthyl-1-ethoxycarbonylpropylsulfide (27.44 g) was mixed with 13.24 g of dimethylsulfuric acid, and the mixture was reacted at 80° C. for 10 hours. The reaction product was dissolved in 300 ml of distillled water and 100 ml of ethyl acetate, the solution was stirred to take out the aqueous solution layer. Potassium hexafluorophosphate (18.41 g) and 300 ml of ethyl acetate were added to the aqueous solution layer, and the mixture was stirred vigorously. The ethyl acetate layer was washed twice with 100 ml of distilled water, the water of the ethyl acetate layer was removed with anhydrous magnesium sulfate, and the ethyl acetate was evaporated, followed by drying at 40° C. under reduced pressure to give the desired product.

[Production of a paint and ink]

In accordance with the composition described in Table 1, an alicyclic epoxy resin, a reactive diluent, an initiator composition and titanium dioxide, etc, were mixed, and fully kneaded by a 3 roll system to prepare a paint and an ink.

[Method of evaluating the properties of a coated film]

(1) Curability: Presence or absence of a tacky feeling through examination by touch.

(2) Transferability: After a packaging container is transferred in an ordinary line, the injury of a coating cured by ultraviolet rays, and the state of peeling were evaluated by seeing with eyes.

(3) Blocking property:
   (i) Metal sheet; 1000 coated metal sheets were piled, and after standing for one day at 50° C., the result was evaluated by the ease of peeling of the sheets.
   (ii) Film: The printed film was wound up through 1000 m, and after standing for one day at room temperature, the result was evaluated by the ease of peeling at the time of winding off.

(4) Color of a coated portion and a printed potion: Evaluated by seeing with eyes to determine whether the yellowish color was within the acceptable range.

(5) Heat-resistant treatability: A gloss down and a surface roughening of a coated film cured with ultraviolet rays were detected by examination of seeing with eyes when the film was heat-treated in a production step of the container.

(6) Retorting treatment: 125° C.–30 minutes retorting with vapor. In the case of a metal can, whiteness, blister and gloss down of the coated film by retorting were evaluated with eyes. In the case of a pouch, the result was evaluated by the presence or absence of delamination.

Example 1

To both surfaces of a tin-free steel sheet having a blank thickness of 0.18 mm and a tempering degree of DR-9 (as surface treated coated amount, the amount of metallic chrome 120 mg/m$^2$, the amount of chromium oxide 15 mg/m$^2$). a biaxially stretched polyethylene terephthalate/isophthalate copolymerized film having a thickness of 20 micron was heat-adhered simultaneously at both surfaces, and immediately cooled with water to form an organic coated metal sheet. The organic coated metal sheet was coated with paraffin wax uniformly, and punched into a circular sheet having a diameter of 160 mm, and molded into a shallow drawn cup in accordance with a customary manner. The draw ratio in this drawing step was 1.59.

The shallow drawn cup was subjected to a primary and secondary redraw formations to obtain a thickness-reduced deep drawn cup. The re-draw formation step molding conditions and the properties of the deep drawn cup by the re-draw formation are shown below.

| | |
|---|---|
| Primary re-draw ratio | 1.23 |
| Secondary re-draw ratio | 1.24 |
| Radius of curvature of a re-draw die working corner | 0.30 mm |
| Radius of curvature of a re-draw die holding corner | 1.0 mm |
| Cup diameter | 66 mm |
| Cup height | 130 mm |
| Side wall thickness reduction rate | −40% |

Thereafter, the cup was subjected to a dome molding by a fixed method, and the deep drawn cup was heat-treated at 215° C. for 1 minute to remove processing distortions of the film and evaporate the lubricant. Then, the edge of the opening end portion was cut off to give a thickness-reduced deep-drawn can having a height of 123 mm.

This thickness-reduced deep-drawn can was coated with Paint A to give a film thickness of 10 micron, and the film was cured by irradiating ultraviolet rays having 500 mJ/cm$^2$ (using a photometer corresponding to a gallium lamp) with the gallium lamp having an output of 240 W/cm. The amount of titanium dioxide contained in the white coated film was 0.67 mg/cm$^2$ per unit area of the coated film. The cured coated film did not have a tack, nor had a problem in color such as strong yellowish color. Then, to print on a white-coated can, the can was transferred through an ordinary line from the coater to the printer. The injury or peeling of the white coated film due to contact with the guide and contact with the can to the can was not seen. According to a customary procedure, a heat-curable ink and a thermosetting finishing varnish were printed and baked on the can, and further the can was subjected to a neck-in molding. Then, the can was packed with water, and a closure was seamed and was subjected to retoring treatment. The can had good retorting resistanace.

Example 2

The can was evaluated in the same way as in Example 1 except that Paint B was coated so that the thickness of the coated film had 6 micron. In the same way as in Example 1, the coated film had good curability, color, transferability, heat-resistant treatment and retorting resistance. In this case, the amount of titanium dioxide contained in the white coated film was 0.40 mg/cm$^2$ per unit area of the coated film.

Example 3

The can was evaluated in the same way as in Example 1 except that Paint C was coated. In the same way as in Example 1, the coated film had good curability, color, transferability, heat-resistant treatment and retorting resistance. In this case, the amount of titanium dioxide contained in the white coated film was 0.67 mg/cm$^2$ per unit area of the coated film.

Example 4

The can was evaluated in the same way as in Example 1 except that Paint D was coated. In the same way as in Example 1, the coated film had good curability, color, transferability, heat-resistant treatment and retorting resistance. In this case, the amount of titanium dioxide contained in the white coated film was 0.67 mg/cm$^2$ per unit area of the coated film.

Comparative Example 1

The can was evaluated in the same way as in Example 1 except that Paint F was coated. Since the amount of the photo-cationic-curing resin was lower than the range of this invention and was less than 1% by weight based on titanium dioxide, suffient curability could not be obtained. The cured coated film was in an almost uncured state.

Comparative Example 2

The can was evaluated in the same way as in Example 1 except that Paint G was coated. Since the amount of the photo-cationiccuring catalyst exceeds the range of the invention, there was no problem with respect to curability and transferability. In baking after the printing, surface roughening was recognized. However, gloss down, whitening and blister due to retorting did not occur.

Comparative Example 3

The can was evaluated in the same way as in Example 1 except that Paint H was coated. Since the amount of the sensitizer was lower than the range of this invention and was less than 1% by weight based on titanium dioxide, sufficient curing could not be obtained, and the cured coated film had a tack. The injury or peeling of the coated film was marked by contacting between cans during transferability in the printing step. In the baking after the printing, gloss down occurred. However, by the effect of the thermosetting property of the photo-cationic-curing catalyst, there was no occurrence of gloss down, whitening and blister due to retorting.

Comparative Example 4

The can was evaluated in the same way as in Example 1 except that Paint I was used. Since the amount of the sensitizer exceeded the range of this invention and was larger than 5% by weight based on titanium dioxide, the white coated film was yellowish and had a very poor outside appearance.

Comparative Example 5

The can was evaluated in the same way as in Example 1 except that Paint K was coated. Since the amount of the sensitizer exceeded the range of this invention and was larger than 5% by weight based on titanium dioxide, the white coated film was yellowish and had a very poor outside appearance.

Example 5

A tinplate having a blank thickness of 0.245 mm, a temper degree of 4 and a spefication of E 2.8/2.8 was punched into a circular plate having a diameter of 142 mm, and the circular tinplate was molded into a cup at a draw ratio of 1.6 and was subjected to steps of re-draw formation (draw ratio of 1.3) and ironing molding (3 steps, a total reduction 67%), and molded into a drawn and ironed cup having an inside diameter of 66 mm. This drawn and ironed cup was cut at the edge of an opening end portion so that its height became 123 mm. By a customary manner, the cup was washed, treated and dried to obtain a drawn-ironed can.

This drawn-ironed can was coated with Paint E to form a film having 8 micron, and the coated film was cured by irradiating ultraviolet rays of 500 mJ/cm$^2$ (using a photometer corresponding to a gallium lamp) by using the gallium lamp having an output of 240 W/cm. The amount of titanium dioxide contained in the white coated film was 0.54 mg/cm$^2$ per unit area of the coated film. The cured film did not have a tack, and there was no problem in color such as a strong yellowish shade. Thereafter, to print the white coated can, the can was transferred through an ordinary line from the coater to the printer, but the injury or peeling of the white coated film due to the contact with the guide or cans with each other was not seen. According to a customary method, the can was printed and baked by using a thermosetting ink and a heat-setting finishing varnish, and then the inner surface of the printed can was sprayed and again baked. When the baked outside surface of the can was compared with the state before baking, no problem such as gloss down due to the lack of curing of the white coated film was seen. Thereafter, this can was subjected to a neck-in molding, and the can was packed with sodium bicarbonate and water, and a closure was seamed on the can and the can was retorted. The can had good retorting resistance.

Example 6

Both surfaces of a tin-free steel sheet having a blank thickness of 0.22 mm and a tempering degree of T4CA and having a vertical size of about 1 m and a width of about 1 m (as a surface-coated amount, the amount of metallic chrome of 120 mg/m$^2$ and the amount of chromium oxide of 15 mg/m$^2$) were coated with an epoxyphenol-type thermosetting paint, and the coated film was baked. Then, the outside surface of the can of the coated sheet was coated with Paint A with a film thickness of 10 micron, and the coated film was cured by irradiating ultraviolet rays having 500 mj/cm$^2$ (using a photometer corresponding to a gallium lamp) with the gallium lamp having an output of 240 W/cm. The amount of titanium dioxide contained in the white coated film was 0.67 mg/cm$^2$ per unit area of the coated film. With respect to the cured coated film did not have a problem of a tack, yellowishness, and blocking. Furthermore, printing was carried out on the white coated film by a sheet-fed press using a thermosetting ink and a heat-curable finishing varnish, but there was no injury or peeling on the white coated film on an outiside surface due to the transferring of the sheet. Furthermore, no gloss down was seen due to baking. Then, the printed sheet was cut by a customary method, and by using a nylon-type adhesive, a can body for a cylindrical adhesion can was formed. Furthermore, neck-in molding was carried out at both ends of the cylinder, and a bottom closure was seamed to a side which would become a bottom portion. Thereafter, the bottom-equipped adhesion can was packed with water, and a top closure was seamed to perform retorting treatment. The retorting resistance was good.

Comparative Example 6

The sheet and the can were evaluated in the same way as in Example 6 except that Paint J was coated. Since the amount of the sensitizer was lower than the range of this invention and was less than 1% by weight based on titanium dioxide, sufficient curing could not be obtained, and the coated sheet caused blocking and had much injury or peeling during transfer. Furthermore, gloss down occurred during baking after the printing. However, there was no gloss down, whitening and blister due to retorting by the effect of the thermosetting property of the photo-cationic-curing catalyst.

Example 7

High-density polyethylene pellets were inserted in an extruder, melted and kneaded, and then, a pipe-shaped product (called "parison") having a diameter of 20 mm was prepared within a die head at the end of the extruder. This parison was inserted in a split mold, a parison portion corresponding to the bottom portion was melted, air was blown, and the melted parison portion was cooled and solidified in the mold and taken out from the mold. An unnecessary burr was removed to give a mouth-containing cylindrical plastic bottle. The outside surface of this bottle was frame-treated, and an ink A as printed to form a coating thickness of 18 micron, and the coated film was cured by irradiating ultraviolet rays having 500 mj/cm$^2$ (using a photometer corresponding to a gallium lamp) with the gallium lamp having an output of 240 W/cm. In this case, the amount of titanium dioxide contained in the white coated film was 0.79 mg/cm$^2$ per unit area of the coated film. The cured film had no tack, nor had a problem of color such as strong yellowishness. The plastic bottle after printing was put into an exclusive carton of corrugated board, and a transportation test was carried out using a truck. However, no injury or peeling of the inked coated film was noted. The bottle showed a good quality.

Example 8

Ink B was printed to a biaxially stretched polyethylene terephthalate film having a thickness of 12 micron corona treated on a side of a printed surface so that a film thickness of 5 micron was obtained. The coated film was cured by irradiating ultraviolet rays having 200 mJ/cm$^2$ (using a photometer corresponding to a gallium lamp) with the gallium lamp having an output of 240 W/cm. In this case, the amount of titanium dioxide contained in the white coated film was 0.43 mg/cm$^2$ per unit area of the coated film. The cured film had no tack, nor a problem of color such as a strong yellowishness. The blocking property of the film was evaluated, but there was no particular problem. The film was pasted with an aluminum foil having a thickness of 7 micron by using a urethane-type adhesive so that the side of the printed surface of the printed film would become an aluminum foil side. On the other surface of this aluminum foil, a polypropylene film having a thickness of 50 micron was pasted with an ordinary method as an inner surface material of the container. The prepared three-layer laminated body was cut, and by heat-sealing, a bag having an opening end only on one side was prepared. This bag was packed with water, the opening end is heat-sealed, and the bag was treated by retorting. A problem of delamination due to the curing insufficiency of the ink was not at all recognized, and good retorting resistance was shown.

Table 2 shows the evaluation results mentioned in Examples and Comparative Examples. The results are expressed by the following items.

○: good
Δ: slightly bad
X: bad
—: not evaluated

TABLE 1

| | Components | Coating composition | | | | | | | | | | | Ink composition | |
|---|---|---|---|---|---|---|---|---|---|---|---|---|---|---|
| | | A | B | C | D | E | F | G | H | I | J | K | A | B |
| (1) | 3,4-epoxycyclohexylmethyl-3,4-epoxycyclohexylcarboxylate | 40 | 40 | 40 | 40 | 40 | 40 | 40 | 40 | 40 | 40 | 40 | 45 | 50 |
| (2) | limonen dioxide | 3 | 3 | 3 | 3 | 3 | 3 | 3 | 3 | 3 | 3 | 3 | | |
| (3) | bisphenol F-type epoxy resin (epoxy equivalent 4300) | 2 | 2 | 2 | 2 | 2 | 2 | 2 | 2 | 2 | 2 | 2 | | |
| (4) | hydroxybutylvinylether | 5 | 5 | 5 | 5 | 5 | 5 | 5 | 5 | 5 | 5 | 5 | | |
| (5) | hexanediolmonovinylether | | | | | | | | | | | | 5 | |
| (6) | epoxidized polybutadiene | | | | | | | | | | | | 10 | |
| (7) | catalyst 1 | 2 | | | 2 | 1 | 0.3 | 10 | 2 | 2 | 2 | 2 | 3 | 2 |
| (8) | catalyst 2 | | 2 | | | | | | | | | | | |
| (9) | catalyst 3 | | | 2 | | | | | | | | | | |
| (10) | (2,4-diethylthioxanthone | 1 | 0.6 | 1 | | 1.5 | 2 | 1 | 0.3 | 3 | | | | 1 |
| (11) | isopropyl thioxanthone (2,4-isomeric mixture) | | | | 2 | | | | | | 0.3 | 3 | 1 | |
| (12) | silicone resin | 0.05 | 0.05 | 0.05 | 0.05 | 0.05 | 0.05 | 0.05 | 0.05 | 0.05 | 0.05 | 0.05 | | |
| (13) | polyethylene wax | 3 | 3 | 3 | 3 | 3 | 3 | 3 | 3 | 3 | 3 | 3 | 3 | |

TABLE 1-continued

| | | Coating composition | | | | | | | | | | | Ink composition | |
|---|---|---|---|---|---|---|---|---|---|---|---|---|---|---|
| Components | | A | B | C | D | E | F | G | H | I | J | K | A | B |
| (14) lanoline wax | | 1 | 1 | 1 | 1 | 1 | 1 | 1 | 1 | 1 | 1 | 1 | 1 | 1 |
| (15) dispersing agent | | 0.1 | 0.1 | 0.1 | 0.1 | 0.1 | 0.1 | 0.1 | 0.1 | 0.1 | 0.1 | 0.1 | 0.1 | 0.1 |
| (16) rutile-type titanium dioxide | | 40 | 40 | 40 | 40 | 40 | 40 | 40 | 40 | 40 | 40 | 40 | 30 | 50 |
| (17) silica fine powder | | | | | | | | | | | | | 10 | |

TABLE 2

| Examples and Comp. Ex. | Paints and inks applied | Containers applied | Amount of titanium dioxide per unit area of the coated film (mg/cm²) | Weight % of photo-cationic-curing catalyst when the weight of titanium dioxide was 100% | Weight % of sensitizer when the weight of titanium dioxide was 100% | Results of evaluation | | | | | |
|---|---|---|---|---|---|---|---|---|---|---|---|
| | | | | | | Curability | Color of the UV-cured film | Transferability | Blocking resistance | Heat-resistant treatability | Retorting resistance |
| Ex.1 | paint A | Thickness-reduced deep drawn can | 0.67 | 5 | 2.5 | ○ | ○ | ○ | — | ○ | ○ |
| Ex.2 | paint B | Thickness-reduced deep drawn can | 0.40 | 5 | 1.5 | ○ | ○ | ○ | — | ○ | |
| Ex.3 | paint C | Thickness-reduced deep drawn can | 0.67 | 5 | 2.5 | ○ | ○ | ○ | — | ○ | |
| Ex.4 | paint D | Thickness-reduced deep drawn can | 0.67 | 5 | 5 | ○ | ○ | ○ | — | ○ | |
| Ex.5 | paint E | Drawn and ironed can | 0.54 | 2.5 | 3.75 | ○ | ○ | ○ | — | ○ | |
| Ex.6 | paint A | Adhesion can (3-piece can) | 0.67 | 5 | 2.5 | ○ | ○ | ○ | ○ | ○ | |
| Ex.7 | ink A | Plastic bottle | 0.79 | 10 | 3.3 | ○ | ○ | ○ | — | — | — |
| Ex.8 | ink B | Pouch | 0.43 | 4 | 2 | ○ | ○ | ○ | ○ | — | ○ |
| Comp.Ex1 | paint F | Thickness-reduced deep drawn can | 0.67 | 0.75 | 5 | X | ○ | Evaluation impossible because of poor curability | | | |
| Comp.Ex2 | paint G | Thickness-reduced deep drawn can | 0.67 | 25 | 2.5 | ○ | ○ | ○ | — | Δ | ○ |
| Comp.Ex3 | paint H | Thickness-reduced deep drawn can | 0.67 | 5 | 0.75 | Δ | ○ | X | — | X | ○ |
| Comp.Ex4 | paint I | Thickness-reduced deep drawn can | 0.67 | 5 | 7.5 | ○ | X strong yellowness | ○ | — | ○ | ○ |
| Comp.Ex5 | paint K | Thickness-reduced deep drawn can | 0.67 | 5 | 7.5 | ○ | X strong yellowness | ○ | — | ○ | ○ |
| Comp.Ex6 | paint J | Adhesion can (3-piece can) | 0.67 | 5 | 0.75 | Δ | ○ | X | X | X | ○ |

What is claimed is:

1. A packaging container having, on the outer surface, a coating layer of a resin composition which comprises (A) a cationic curable resin comprising an alicyclic epoxy resin, (B) a photo-cationic-curing catalyst comprising a compound of the following formula (1),

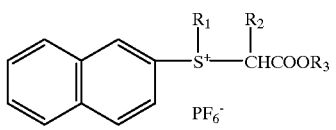

wherein each of $R_1$ and $R_2$ is an alkyl group, and they may be the same or different, and $R_3$ is an alkyl group, (C) a sensitizer comprising a thioxanthone sensitizer, and (D) a pigment comprising titanium dioxide, said resin composition being cured by ultraviolet ray, wherein the amount of said titanium dioxide is at least 0.30 mg per 1 cm² of said coating layer, the amount of said photo-cationic-curing catalyst is 1 to 20% by weight with regards to said titanium dioxide, and the amount of said sensitizer is 1.5 to 5% by weight with regards to said titanium dioxide.

2. A packaging container according to claim 1, wherein the photo-cationic-curing catalyst is 2-naphthyl-1-ethoxycarbonylethylmethylsulfonium hexafluorophosphonate, 2-naphthyl-1-methoxycarbonylethylmethylsulfonium hexafluorophosphonate, or 2-naphthyl-1-ethoxycarbonylpropylmethylsufonium hexafluorophosphonate.

3. A packaging container according to claim 1 or 2, wherein the container is a can composed of a metallic material.

4. A packaging container according to claim 1 or 2, wherein the container is a bottle composed of a thermoplastic resin.

5. A packaging container according to claim 1 or 2, wherein the container is a pouch composed of a thermoplastic resin laminate or a thermoplastic resin-metal foil laminate.

6. A container closure having, on the outer surface, a coating layer of a resin composition which comprises (A) a cationic curable resin comprising an alicyclic epoxy resin, (B) a photo-cationic-curing catalyst comprising a compound of the following formula (1),

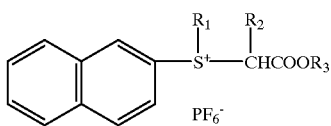

wherein each of $R_1$ and $R_2$ is an alkyl group, and they may be the same or different, and $R_3$ is an alkyl group, (C) a sensitizer comprising thioxanthone sensitizer, and (D) a pigment comprising titanium dioxide, said resin composition being cured by ultraviolet ray, wherein the amount of said titanium dioxide is at least 0.30 mg per 1 cm² of said coating layer, the amount of said photo-cationic-curing catalyst is 1 to 20% by weight with regards to said titanium dioxide, and the amount of said sensitizer is 1.5 to 5% by weight with regards to said titanium dioxide.

7. A container closure according to claim 6, wherein the photo-cationic-curing catalyst is 2-naphthyl-1-ethoxycarbonylethylmethylsulfonium hexafluorophosphonate, 2-naphthyl-1-methoxycarbonylethylmethylsulfonium hexafluorophosphonate, or 2-naphthyl-1-ethoxycarbonylpropylmethylsulfonium hexafluorophosphonate.

8. A container closure according to claim 6 or 7, wherein the container closure is a closure composed of a metallic material.

9. A container closure according to claim 6 or 7, wherein the container closure is a closure composed of a thermoplastic resin.

\* \* \* \* \*